United States Patent
Christofferson et al.

(10) Patent No.: US 6,707,400 B2
(45) Date of Patent: Mar. 16, 2004

(54) METHOD AND APPARATUS FOR FAST LONGEST MATCH SEARCH

(75) Inventors: Jan Christofferson, Luleå (SE); David Karell, Härnösand (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 23 days.

(21) Appl. No.: 10/153,302

(22) Filed: May 22, 2002

(65) Prior Publication Data

US 2003/0025621 A1 Feb. 6, 2003

Related U.S. Application Data

(60) Provisional application No. 60/309,983, filed on Aug. 2, 2001.

(51) Int. Cl.[7] ................................................. H03M 7/00
(52) U.S. Cl. ........................... 341/106; 341/50; 341/51; 341/67
(58) Field of Search ........................... 341/106, 51, 50, 341/67

(56) References Cited

U.S. PATENT DOCUMENTS

| | | | | |
|---|---|---|---|---|
| 4,558,302 A | * | 12/1985 | Welch ........................... | 341/51 |
| 5,151,697 A | * | 9/1992 | Bunton ........................ | 341/51 |
| 5,373,290 A | * | 12/1994 | Lempel et al. ................. | 341/51 |
| 5,455,576 A | * | 10/1995 | Clark et al. .................... | 341/50 |
| 5,455,943 A | * | 10/1995 | Chambers, IV .............. | 341/51 |
| 5,577,248 A | | 11/1996 | Chambers, IV ................ | 707/1 |
| 5,602,764 A | | 2/1997 | Eskandari-Gharnin et al. ........................... | 708/210 |
| 5,805,086 A | * | 9/1998 | Brown et al. .................. | 341/51 |
| 6,226,628 B1 | | 5/2001 | Forbes ........................... | 707/1 |

FOREIGN PATENT DOCUMENTS

| | | |
|---|---|---|
| EP | 0 643 491 A1 | 3/1995 |

OTHER PUBLICATIONS

ISR PCT/SE 02/01410; Mailed Oct. 28, 2002.

* cited by examiner

*Primary Examiner*—Jean Jeanglaude

(57) ABSTRACT

Method and apparatus for conducting a search to match a string of symbols of a sequence of symbols with a stored string of symbols in a dictionary to provide a matched string of symbols. In the method, after a matched string of symbols of the sequence of symbols has been found, beginning from a first position in the dictionary in which the first symbol of the matched string is stored, it is determined if a longer matched string of symbols can be found by first comparing a chosen symbol that follows the matched string of symbols in the sequence of symbols with a symbol stored in a corresponding position in the dictionary, beginning with another position in the dictionary in which the first symbol is stored, to determine whether the symbol stored in the corresponding position matches the chosen symbol. If the comparison does not result in a match, it is immediately known that a longer string of matched symbols has not been found and it maybe possible to omit additional comparing steps. The method provides a more efficient procedure for conducting a longest match search and, at the same time, utilizes a data structure that permits the dictionary to be easily updated.

16 Claims, 3 Drawing Sheets

| Position | 1 | 2 | 3 | 4 | 5 | 6 | 7 | 8 | 9 | 10 | 11 |
|---|---|---|---|---|---|---|---|---|---|---|---|
| Symbol | a | d | e | a | a | b | c | e | a | b | e |
| Pointer | * | * | * | 1 | 4 | * | * | 3 | 5 | 6 | 8 |

| Position | 1 | 2 | 3 | 4 | 5 | 6 | 7 | 8 | 9 | 10 | 11 |
|---|---|---|---|---|---|---|---|---|---|---|---|
| Dict. | a | d | e | a | a | b | c | e | a | b | e |
| A1 | a | d | e | a | a | b | c | e | a | b | e |

FIG. 2

| Position | 1 | 2 | 3 | 4 | 5 | 6 | 7 | 8 | 9 | 10 | 11 |
|---|---|---|---|---|---|---|---|---|---|---|---|
| Symbol | a | d | e | a | a | b | c | e | a | b | e |
| Pointer | * | * | * | 1 | 4 | * | * | 3 | 5 | 6 | 8 |

FIG. 3

| Symbol | a | b | c | d | e | f | g | h | . | . | . |
|---|---|---|---|---|---|---|---|---|---|---|---|
| Pointer | 9 | 10 | 7 | 2 | 11 | * | * | * | * | * | * |

FIG. 4

| Dictionary | a | c | c | d | a | b | c | c | f | a | b | d |
|---|---|---|---|---|---|---|---|---|---|---|---|---|
| Comparison # |  | 8 | 7 | 6 |  | 4 | 3 | 5 |  |  | 1 | 2 |

FIG. 6

METHOD AND APPARATUS FOR FAST LONGEST MATCH SEARCH

This application claims the benefit of copending U.S. Provisional Patent Application Ser. No. 60/309,983 filed Aug. 2, 2001.

BACKGROUND OF THE INVENTION

1. Field of the Invention

The present invention relates generally to the data compression field; and, more particularly, to a method and apparatus for conducting a longest match search in a lossless dictionary compression procedure.

2. Description of the Prior Art

The compression of large ASCII (American Standard Code for Information Interchange) files having many repeated signal strings is frequently carried out using a dictionary compression procedure such as Lempel-Ziv compression (see Salomon, D., *Data Compression The Complete Reference*, Springer-Verlag, New York, Inc., 1998). Dictionary compression procedures compress files by replacing strings of consecutive symbols in the file by reference to a separate dictionary file or index, or to previous occurrences in the file that is being compressed. Dictionary compression techniques, however, are inefficient when compressing small data files or messages unless a large dictionary or look-up table is available. In general, a large dictionary yields more efficient compression than a smaller dictionary.

Much of the signaling traffic over the Internet is generated by ASCII-based protocols such as, for example, SIP (see Handley, M., Schulzrinne, H., Schooler, E. and Rosenberg, J., *SIP: Session Initiation Protocol*, IETF RFC 2543, 2000); SDP (see Handley, M. and Jacobson, V., *SDP: Session Description Protocol*, IETF RFC 2327, 2000); HTTP (see Fielding, R. et al., *Hypertext Transfer Protocol-HTTP/1.1*, IETF RFC 2616, 2000) and RTSP (see Schulzrinne, H., Rao, A. and Lanphier, R., *Real Time Streaming Protocol* (RTSP), IETF RFC 2326, 2000). The message size for each of these protocols is relatively small; and, consequently, a large dictionary must be used in order to obtain efficient compression. This can be achieved either by using a large static dictionary or by continuously updating a dynamic dictionary using messages that have already been sent during a session. Static and dynamic dictionaries can also be combined and used, for example, in the compression framework Roger (see R. Price, H. Hannu, et al., *Signaling Compression, draft-ietf-rohc-sigcomp*-06.txt) Internet Draft (work in progress), May 2002, and H. Hannu, J. Christoffersson, et al., SigComp-Extended Operations, (draft-ietf-rohc-sigcomp-extended-03.txt) Internet Draft (work in progress), May 2002).

Of considerable importance to achieving efficiency in terms of memory and processor usage in a dictionary compression procedure is the manner in which the compression is carried out, e.g., how the search algorithm used for longest match searches is designed. The standard longest match search methods used in Lempel-Ziv or other dictionary compression schemes are typically either of linear type (LZ77) or involve searching in binary trees (LZSS), (see, for example, the Salomon publication referred to above).

Linear searches are slow but can be carried out rather easily. Changing the dictionary, for example, updating the dictionary by appending or deleting text, is also easy to accomplish. Searching in binary trees is a much faster method; however, with binary search trees, it is a relatively slow operation to append or delete text from the dictionary and to correspondingly update the binary search tree.

There is, accordingly, a need for a dictionary compression procedure that includes a longest match search method and apparatus that is fast and that also utilizes a data structure that is easy to update when the dictionary is changed from time to time.

SUMMARY OF THE INVENTION

The present invention provides a longest match search method and apparatus for a dictionary compression procedure that is very fast and that utilizes a data structure that is easy to update when text is appended to or deleted from the dictionary.

According to the present invention, a method for conducting a search to match a string of symbols of a sequence of symbols with a stored string of symbols in a dictionary to provide a matched string of symbols comprises the steps of matching a string of symbols of the sequence of symbols, beginning with a selected symbol of the sequence of symbols, with a first stored string of symbols, beginning with a first position in the dictionary in which the selected symbol is stored, to provide a known matched string of symbols; identifying another position in the dictionary in which the selected symbol is stored; choosing a symbol of the sequence of symbols that follows the known matched string of symbols in the sequence of symbols; and comparing the chosen symbol of the sequence of symbols with a symbol stored in a corresponding position in the dictionary, beginning with the another position, to determine whether the symbol stored in the corresponding position matches the chosen symbol, wherein if the comparing step results in a match, determining if a string of symbols under examination between the selected symbol and the chosen symbol matches a stored string of symbols in the dictionary beginning with the symbol stored in the another location, to determine if the string of symbols under examination is longer than the known matched string of symbols.

The present invention recognizes that the number of comparisons that must be conducted in order to find a second matched string of symbols that is longer than a known matched string of symbols can often be reduced by first choosing a symbol in the sequence of symbols that follows the first matched string of symbols to define a string of symbols under examination, and then comparing the chosen symbol with a symbol stored in a corresponding position in the dictionary beginning with another position in which the selected symbol is stored. In particular, if this comparison does not result in a match, it may be unnecessary to compare intermediate symbols in the string of symbols under investigation. By reducing the number of comparisons that must be made, the overall time required to conduct the match search can be reduced.

According to a presently preferred embodiment of the invention, the chosen symbol comprises the first symbol in the sequence of symbols that follows the known matched string of symbols. If this chosen symbol does not match the symbol stored in the corresponding position in the dictionary, it is known with certainty that the string of symbols under investigation cannot be longer than the known matched string of symbols. Accordingly, it is unnecessary to compare other symbols of the string of symbols under investigation with symbols stored in corresponding positions in the dictionary. Particularly when the known matched string of symbols comprises many symbols, the method according to the present invention can eliminate a substantial number of comparisons and thus significantly shorten the time required to complete the match search method.

According to a further embodiment of the invention, the match search method comprises a longest match search method, and the identifying step comprises identifying all positions in the dictionary in which the selected symbol is stored. A string of symbols under investigation is then checked with respect to a string of symbols stored in the dictionary beginning with each position in the dictionary in which the selected symbol occurs to identify the longest possible matched string of symbols.

According to a further embodiment of the invention, the selected symbol comprises the first symbol of the sequence of symbols, and the first position in the dictionary comprises the most recent position in the dictionary in which the first symbol is stored. The another position in the dictionary comprises the second most recent position in which the first symbol is stored. The method is continued through the dictionary until all positions in which the first symbol is stored have been identified and the comparison made so as to identify the longest possible match.

According to yet a further embodiment of the invention, an apparatus for conducting a longest match search to find a longest possible match between a string of symbols of a sequence of symbols and a stored string of symbols in a dictionary comprises a dictionary and a processor. The dictionary includes first and second arrays and a table. The first array comprises each symbol stored in the dictionary. The second array comprises pointers to a previous position of each of the symbols stored in the first array, and the table comprises pointers to positions of the last occurrences in the first array of each symbol stored in the first array. The processor conducts a longest match search to identify a longest possible string of matched symbols utilizing the dictionary comprising the first and second arrays and the table. The apparatus of the invention not only permits a longest match search to be conducted more efficiently, but also permits the dictionary to be easily updated with new symbols or strings of symbols when required.

The match search method and apparatus according to the present invention can readily be incorporated into a lossless dictionary compression procedure such as Lempel-Ziv compression to facilitate the overall compression process. These capabilities provided by the present invention are important in many applications including applications that use the compression framework ROGER.

Yet further objects, features and advantages of the present invention will become apparent hereinafter in conjunction with the following detailed description of presently preferred embodiments thereof.

BRIEF DESCRIPTION OF THE DRAWINGS

FIG. 2 is a chart that illustrates the relationship between the dictionary and the first array of FIG. 1;

FIG. 3 is a chart that illustrates the relationship between the first and second arrays of FIG. 1;

FIG. 4 is a chart that illustrates the relationship between the first array and the table of FIG. 1;

FIG. 6 is a chart provided to assist in explaining the present invention.

DETAILED DESCRIPTION OF PRESENTLY PREFERRED EMBODIMENTS

Figure 1:
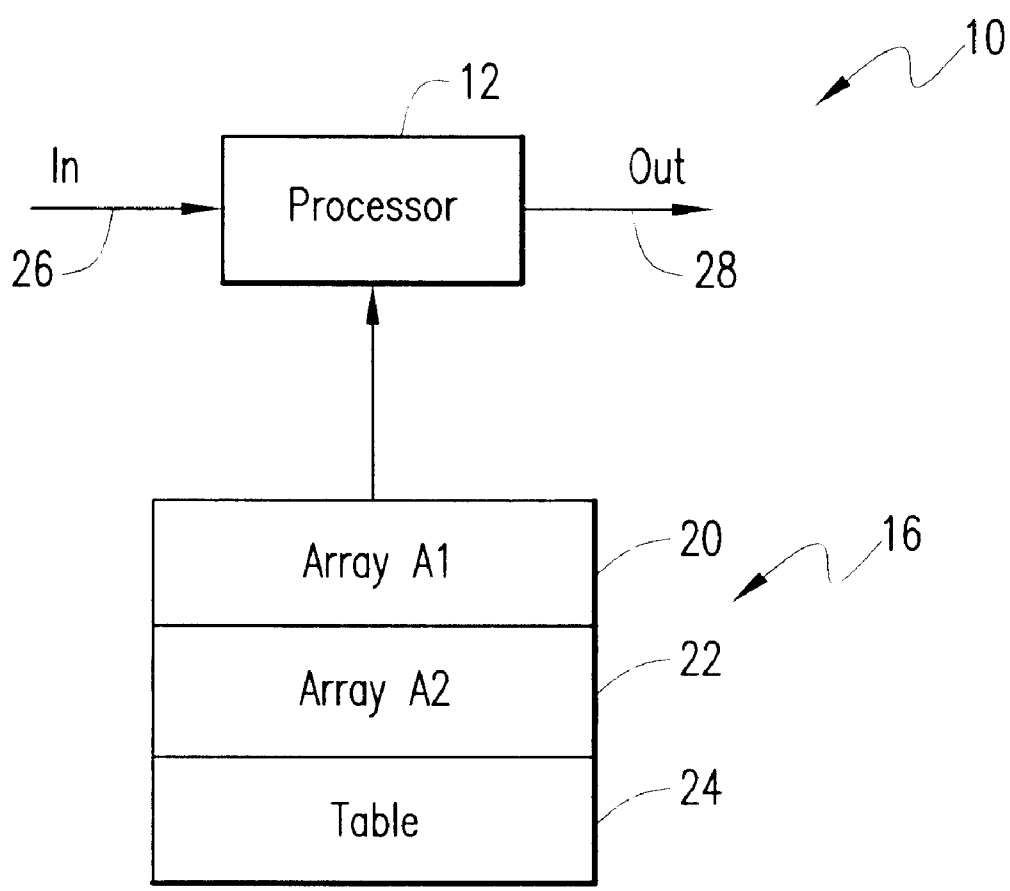
FIG. 1 is a block diagram that schematically illustrates an apparatus for compressing data according to a presently preferred embodiment of the present invention.

FIG. 1 is a block diagram that schematically illustrates an apparatus for compressing data according to a presently preferred embodiment of the invention. The apparatus is generally designated by reference number 10 and includes a processor 12 and an associated dictionary 16. As is known to those skilled in the art, the dictionary 16 stores a plurality of different strings of symbols together with appropriate indices corresponding to each of the stored strings of symbols. Each string of symbols comprises one or a plurality of consecutive symbols. In order to compress a particular sequence of symbols, the sequence is divided into a plurality of strings of symbols, and each of the plurality of strings of symbols is separately encoded by matching the string with a stored string of symbols in the dictionary and then replacing the matched string with the index that corresponds to that particular string. As shown in FIG. 1, processor 12 receives an input sequence of symbols 26 to be compressed, compresses the sequence of symbols utilizing the dictionary 16, and provides an output compressed sequence of symbols 28.

In order to achieve efficient compression utilizing a dictionary compression procedure, it is important that each string of symbols of the sequence of symbols to be compressed be as long as possible, i.e., comprise as many symbols as possible. As a result, known dictionary compression procedures include a "longest match search" to identify the longest possible strings of symbols of the sequence of symbols that match strings of symbols stored in the dictionary. As discussed previously, however, known longest match search methods are either slow, and thus inefficient; or are not very useful when the dictionary is updated, as occurs from time to time.

The present invention provides a method and apparatus for conducting a longest match search in a dictionary compression procedure that is fast and, at the same time, that utilizes a data structure that is very useful when the dictionary must be updated. As illustrated in FIG. 1, the dictionary can be considered as including a data structure that comprises first and second arrays 20 and 22, sometimes referred to herein as arrays A1 and A2, and a table 24. The first array 20 comprises all the symbols stored in the dictionary such that the first symbol stored in the dictionary is the first symbol in the first array, the second symbol stored in the dictionary is the second symbol in the first array, and so on. The correspondence between the dictionary and the first array 20 is illustrated in FIG. 2 wherein symbols stored in consecutive positions in the dictionary, e.g., symbols a, d, e, a, etc. are represented as being stored in corresponding consecutive positions in the first array. (It should be understood that in practice, the first array is not a copy of the symbols stored in the dictionary and it is not necessary to actually copy information from the dictionary into the first array. The dictionary and the first array are the same structure, and the first array is described herein simply to facilitate a clear understanding of the present invention.)

The second array 22 holds pointers to the previous positions of the symbols in the first array such that the i'th element in the second array is a pointer to the position of the previous occurrence of the symbol in the i'th position in the first array. In particular, with the first array 20 denoted as array A1 and the second array 22 denoted as array A2, the i'th element in array A1 can then be denoted A1(i). Array A2, holds pointers to the previous positions of symbols in A1 in such a way that the i'th element in array A2 is a pointer to the position of the previous occurrence of the symbol in the i'th position in array A1. In other words, A2(i) is a pointer to the most recent previous position in the first array in which the symbol A1(i) is also stored.

The relationship between arrays A1 and A2 is illustrated in FIG. 3. Specifically, as shown in FIG. 3, the symbol "a"

is in position 4 in array A1, and the most recent previous occurrence of symbol "a" is in position 1 in array A1. The pointer in position 4 in array A2 thus points to position 1 in array A1. The symbol "a" next appears in position 5 in array A1. Since the most recent occurrence of this symbol is now in position 4 of array A1, the pointer in position 5 of array A2 points to position 4 in array A1. In a similar manner, each symbol in a particular position in array A1 has a corresponding pointer in the same position in array A2 that points to the position in array A1 in which that particular symbol most recently occurred. The "*" designation in various positions in array A2 in FIG. 3 indicates that no previous occurrence of the symbol in the corresponding position in array A1 exists, i.e., the position contains the first occurrence of a particular symbol in array A1.

Table 24 includes pointers that identify the last positions in the first array A1 of each symbol that is present in array A1; and, correspondingly, that is present in the dictionary. This relationship can best be understood with reference to FIGS. 2 and 4. Specifically, as shown in FIG. 2, the last occurrence of the symbol "a" in array A1 is at position 9 in the array. Accordingly, as illustrated in FIG. 4, the pointer in table 24, indicates that the symbol "a" in array A1 last occurred in position 9 of array A1. Similarly, FIG. 4 shows that symbol "b" last occurred in position 10 of array A1, that symbol "c" last occurred in position 7 of array A1 and so on. Thus, table 24 contains pointers to the last occurrence of each symbol stored in array A1 (e.g., a, b, c, d, e, etc.). In FIG. 3, the "*" designation indicates that a particular symbol does not occur at any position in array A1; and, thus, is not present in the dictionary. As will be explained more fully hereinafter, table 24 is particularly useful when initiating a longest match search.

The first and second arrays A1 and A2 and the table are all used to conduct longest match searches in order to identify the longest possible strings of symbols of the sequence of symbols 26 that can be matched with stored strings of symbols in the dictionary 16 so as to efficiently compress the sequence of symbols. Consider, for example, that it is desired to compress a sequence of symbols "c" comprised of symbols c(1), c(2), c(3), . . . c(j). The first symbol of the sequence is symbol c(1), and any position in the dictionary in which c(1) occurs is a possible position where a longest match between a string of symbols of the sequence of symbols beginning with c(1) and a stored string of symbols could start. The positions in the dictionary in which c(1) occurs can be found by following the pointers in table 24 and in the second array 22. Each of these occurrences must be examined during a longest match search in order to be assured of locating the longest stored string of symbols in the dictionary that can be matched with a string of symbols of the sequence of symbols to be compressed. A method for conducting a longest match search utilizing the apparatus of FIG. 1 according to another embodiment of the present invention is described below.

Initially, the pointer in table 24 that identifies the last occurrence of symbol c(1) in array A1 (and, hence, the last position in the dictionary in which c(1) occurs) is examined. Suppose that the pointer in table 24 points to position p1 in the dictionary, corresponding to position A1 (p1) in array A1, as being the last occurrence of symbol c(1) in the dictionary. Symbol c(2) in the sequence of symbols is then compared with the symbol in position p1+1 of the dictionary; corresponding to position A1(p1+1) in array A1; symbol c(3) is compared with the symbol in position p1+2 of the dictionary; corresponding to position A1(p1+2) in array A1, and so on in order to determine the length of the match, i.e., the number of consecutive symbols of the sequence of symbols that match symbols stored in corresponding consecutive positions in the dictionary beginning with position p1. Suppose that the length of this match is three symbols such that symbols c(1), c(2) and c(3) are stored at positions A1(p1), A1(p1+1) and A1(p1+2); but that symbol c(4) of the sequence of symbols and the symbol in position A1(p1+3) do not match. Thus, a matched string of symbols that is three symbols long has been found.

In order to determine if a longer match exists, i.e., if a matched string of symbols of more than three symbols in length can be found; the pointer in array A2 is used to identify the position in the dictionary in which the most recent previous occurrence of symbol c(1) occurs. If this position in the dictionary is designated as position "p2", the pointer to this position is given by the second array as p2=A2(p1). In other words, the pointer to the most recent previous occurrence (p2) of symbol c(1) is in the position (p1) in array A2.

Next, it is determined if a longer string of symbols of the sequence of signals (i.e. a string more than three symbols long) can be matched with a stored sequence of symbols in the dictionary starting with position p2 of the dictionary. This longer string of symbols can be referred to as a string of symbols under examination, and the determination is made by first comparing the last symbol of the string of symbols under examination with the symbol in the corresponding position of the dictionary beginning with position p2. Thus, unmatched symbol c(4) of the sequence of symbols is compared with the symbol in position A1(p2+3) in array A1. Specifically, if the string of symbols under examination is four symbols long, the fourth symbol of the sequence of signals under examination is compared with the symbol in the fourth position in the dictionary starting with position p2 to see if they match. If the comparison does not result in a match, it is immediately known that the string of symbols under examination cannot result in a matched string of symbols that is more than three symbols long, at least with respect to a string of symbols beginning at position p2 of the dictionary, and no further examination of the string of symbols under examination is necessary.

If the comparison does result in a match, it is then known that both symbols c(1) and c(4) of the string of symbols under examination match symbols in corresponding positions in the dictionary beginning with position p2. It is still not known, however, if symbols c(2) and c(3) of the string of symbols under examination match the symbols in positions p2+1 and p2+2, respectively, of the dictionary as is necessary if the string of symbols under examination matches a string of symbols stored in the dictionary beginning with position p2. Accordingly, symbols c(2) and c(3) are next compared with the symbols in positions p2+1 and p2+2, respectively, of the dictionary to determine if the match is, in fact, at least four symbols long.

From the above description, it should be apparent that by comparing the last symbol in a string of symbols under examination with the symbol in the corresponding position in the dictionary before comparing intermediate symbols of the string of symbols under examination with the symbols in corresponding positions in the dictionary, comparing the intermediate symbols may become unnecessary and can be omitted from the method. Thus, the method can result in a reduction in the number of comparing steps permitting the longest match search to be conducted more quickly. The number of comparing steps that can be omitted can become particularly significant when the string of symbols under examination is long.

If there is a match between symbols c(1) to c(4) of the string of symbols under examination and the symbols in corresponding positions in the dictionary beginning with position p2, a longer matched string of symbols that is at least four symbols long has been found. The exact length of the match must then be determined. This requires comparing symbols c(5), c(6) and so on to the symbols in the corresponding positions in the dictionary, i.e., the symbols in positions p2+4, p2+5 and so on until a no match condition is found.

Suppose that the matched string of symbols starting with the symbol at position p2 in the dictionary has a length of k symbols. The pointer to the third most recent occurrence of symbol c(1) in the dictionary is then followed. This pointer is given in the second array A2 by p3=A2(p2). In other words, the third most recent occurrence of symbol c(1) is in position p3 of the dictionary and is found by using the pointer in array A2 that is in a position corresponding to the second most recent occurrence of symbol c(1) in array A1. Since the longest match so far known is k symbols long, as indicated above, such that there is a matching string of consecutive symbols extending from symbol c(1) to symbol c(k) of the sequence of symbols; a new string of symbols under examination is evaluated, again by first comparing the last symbol of the new string of symbols under examination with the symbol stored in the corresponding position in the dictionary, this time beginning with position p3. Thus, if the new string of symbols under examination is k+1 symbols long, a comparison is first performed between symbol c(k+1) of the sequence of symbols and the symbol stored in position p3+k in the dictionary (corresponding to position A1(p3+k) in array A1. Again, only if this comparison results in a match, is there a possibility that the new string of symbols under examination is longer than the matched string of symbols so far found.

The longest possible matched string of symbols is found by identifying all positions in the dictionary in which symbol c(1) is stored and determining if a string of symbols under examination match strings of symbols in the dictionary beginning with each of the identified positions. Preferably, as described above, this is done by examining positions in which c(1) is stored in order from the most recent position to the least recent position. Once the longest possible match has been found, that longest possible string of symbols is then encoded, and another longest possible string of symbols, beginning with the next symbol in the sequence of symbols, is searched for.

Figure 5:
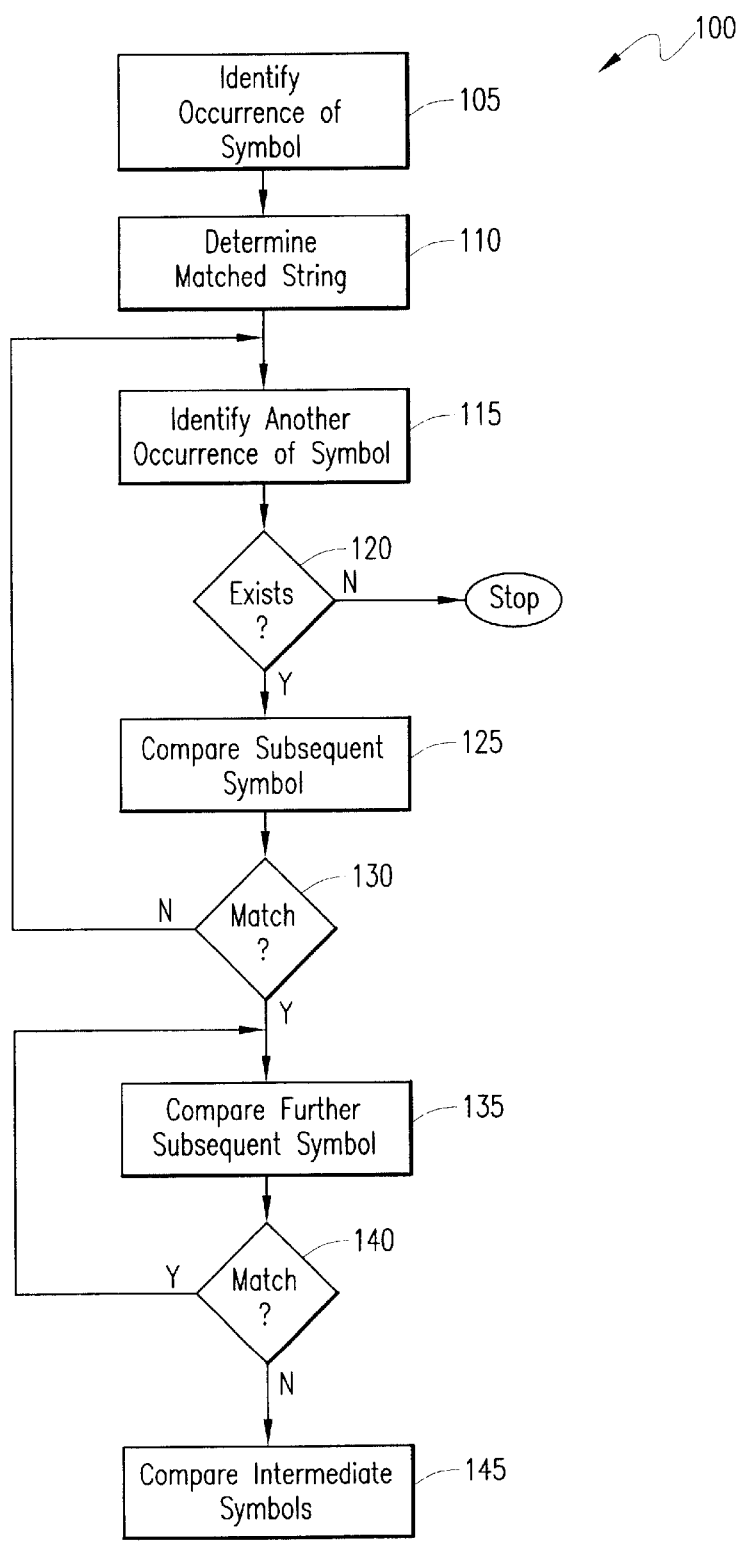
FIG. 5 is a flow chart that illustrates steps of a method for compressing data utilizing a longest match search according to a further embodiment of the present invention.

FIG. 5 is a flow chart that illustrates steps of a longest match search method 100 according to another embodiment of the present invention. Initially, the position, in the dictionary, of the most recent occurrence of the first symbol (c1) of a sequence of symbols to be compressed is identified (step 105). Then, beginning with the first symbol (c1), the number of consecutive symbols of the sequence of symbols that match symbols stored in consecutive positions in the dictionary beginning with the position of the most recent occurrence is determined (step 110). Assume that the matching string of symbols determined in step 110 is k symbols long.

The position of the next most recent occurrence of the symbol c(1) in the dictionary is then identified (step 115). If a next occurrence exists (Y output of step 120), the method continues. Assume the next most recent occurrence is at position p in the dictionary. A comparison is then made between the symbol c(k+n) of the sequence of symbols to be compressed and the symbol at position p+k−1+n to determine if the symbols match (step 125). It should be noted that in the presently preferred embodiment described previously, n=1 although n could be a larger number if desired. If there is a match (Y output of step 130), there could be a match of at least k+n symbols. In such case, further subsequent symbols are compared as shown in step 135. Initially, the symbol c(k+2n) is compared with the symbol in position p+k−1+2n. If these symbols match (Y output of step 140), there could be match of at least k+2n). Steps 135 and 140 are then repeated with yet further subsequent symbols of the sequence of symbols, i.e., symbols c(k+3n), c(k+4n), etc. until a comparison results in no match (N output of step 140). Intermediate symbols of the sequence of symbols are then compared with symbols occupying corresponding intermediate positions in the dictionary (step 145) to see if there is, in fact, a longer matched string of symbols.

If the result of the comparison in step 125 indicates that there is no match (N output of step 130), the method returns to step 115 and another occurrence of symbol c(1) in the dictionary is located. If there are no more positions in the dictionary at which c(1) occurs (N output step 120), the longest possible match has been found and the process stops.

FIG. 6 is a chart that exemplifies the search method described above. In FIG. 6, a match to the string a, b, c, d is being searched for. The comparisons that are made during the longest match search are indicated on the second row of the chart. In particular, the longest match to the string a, b, c, d is found through the comparisons 1, 2 . . . . . . 8.

Searching several symbols ahead in the above-described fashion is particularly advantageous when there is one very long match and several short matches in the dictionary as sometimes occurs when compressing protocol messages from, e.g., SIP/SDP. The present invention, in general, provides a fast search method for a data structure that is particularly useful when a dictionary is changed from time to time. The usefulness of the data structure results from the ease in which the data structure can be updated with new symbols or strings of symbols. Such a capability is especially important in many situations, such as when using ROGER.

It should be understood that the term "comprises/comprising" when used in this specification is taken to specify the presence of stated features, integers, steps or components; but does not preclude the presence or addition of one or more other features, integers, steps, components or groups thereof.

While what has been described herein constitutes presently preferred embodiments of the invention, it should be understood that the invention can be varied in numerous ways without departing from the scope thereof. Accordingly, it should be recognized that the invention should be limited only insofar as is required by the scope of the following claims.

What is claimed is:

1. A method for conducting a search to match a string of symbols of a sequence of symbols with a stored string of symbols in a dictionary to provide a matched string of symbols, comprising:

matching a string of symbols of the sequence of symbols, beginning with a selected symbol of said sequence of symbols, with a stored string of symbols, beginning with a first position in the dictionary in which the selected symbol is stored, to provide a known matched string of symbols;

identifying another position in the dictionary in which the selected symbol is stored;

choosing a symbol of the sequence of symbols that follows the known matched string of symbols in the sequence of symbols; and comparing the chosen symbol of the sequence of symbols with a symbol stored in a corresponding position in the dictionary, to determine whether the symbol stored in the corresponding position matches the chosen symbol, wherein if the comparing step results in a match, determining if a string of symbols under examination between the selected symbol and the chosen symbol matches a stored string of symbols in the dictionary beginning with the symbol stored in the another location, to determine if the string of symbols under examination is longer than the known matched string of symbols, wherein the identifying, choosing and comparing steps are repeated until all positions in said dictionary in which said selected symbol occurs have been identified to find the longest possible matched string of symbols.

2. The method according to claim 1, wherein said selected symbol comprises a first symbol of said sequence of symbols.

3. The method according to claim 1, wherein said first position comprises a most recent position in said dictionary in which said selected symbol occurs.

4. The method according to claim 3, wherein said another position comprises a second most recent position in said dictionary in which said selected symbol occurs.

5. The method according to claim 1, wherein said choosing step comprises choosing a next symbol in said sequence of symbols that immediately follows said known matched string of symbols, and wherein if the comparing step does not result in a match, it is known that the string of symbols under examination is not longer than the known matched string of symbols.

6. The method according to claim 1, wherein all said positions in which said selected symbol occurs are identified in order from the most recent occurrence to the least recent occurrence.

7. In a dictionary compression procedure for compressing a sequence of symbols by separately encoding strings of symbols of said sequence of symbols using a dictionary that stores a plurality of strings of symbols, a longest match search method for finding a longest possible string of symbols to be encoded, the method comprising:

matching a string of symbols of the sequence of symbols, beginning with a selected symbol of said sequence of symbols, with a stored string of symbols in said dictionary, beginning with a first position in the dictionary in which the selected symbol is stored, to provide a known matched string of symbols;

identifying another position in the dictionary in which the selected symbol is stored;

choosing a symbol of the sequence of symbols that follows the known matched string of symbols in the sequence of symbols;

comparing the chosen symbol of the sequence of symbols with a symbol stored in a corresponding position in the dictionary, beginning with the another position, to determine whether the symbol stored in the corresponding position matches the chosen symbol, wherein if the comparing step results in a match, determining if a string of symbols under examination between the selected symbol and the chosen symbol matches a stored string of symbols beginning with the symbol stored in the another location in the dictionary, to determine if the string of symbols under examination is longer than the known matched string of symbols; and repeating the identifying, choosing and comparing steps until all positions in said dictionary in which said selected symbol occurs have been identified.

8. The method according to claim 7, wherein all said positions in which said selected symbol occurs are identified in order from the most recent occurrence to the least recent occurrence.

9. The method according to claim 7, wherein said selected symbol comprises a first symbol of said sequence of symbols.

10. The method according to claim 7, wherein said first position comprises a most recent position in said dictionary in which said selected symbol occurs.

11. The method according to claim 10, wherein said another position comprises a second most recent position in said dictionary in which said selected symbol occurs.

12. The method according to claim 7, wherein said choosing step comprises choosing a next symbol in said sequence of symbols that immediately follows said known matched string of symbols, and wherein if the comparing step does not result in a match, it is known that the string of symbols under examination is not longer than the known matched string of symbols.

13. An apparatus for conducting a longest match search to find a longest possible match between a string of symbols of a sequence of symbols and a stored string of symbols in a dictionary, the apparatus comprising:

a dictionary; and a processor;

said dictionary including first and second arrays and a table, said first array comprising each symbol stored in the dictionary, the second array comprising pointers to a previous position of each of the symbols stored in the first array, and the table comprising pointers to positions of the last occurrences in the first array of each symbol stored in the first array, wherein said processor conducts a longest match search by comparing a last symbol in a string of symbols under examination with a symbol in the corresponding position in the dictionary before comparing intermediate symbols of the string of symbols under examination with symbols in corresponding position in the dictionary to identify a longest possible string of matched symbols.

14. The apparatus according to claim 13, wherein said apparatus is incorporated in a system for compressing said longest possible string of matched symbols.

15. The apparatus according to claim 13, and further including at least one memory for storing said dictionary.

16. A method for performing a longest match search, the method comprising:

a) receiving a sequence of symbols to match a word in the dictionary, b) identifying a symbol of interest at position c(i) in the sequence of symbols, c) initializing a value for an examined position (ep) to be:

$$ep = p + k - 1 + n$$

where, p is a first position of the symbol of interest in the dictionary, k is the length of the longest match a first matched string in the sequence of symbols and a second matched string in the dictionary, and, n is an incrementing value, d) locating the examined position within the dictionary, e) determining if a first symbol located at position c(k+n) in the sequence of symbols matches a second symbol located at the examined position in the dictionary, if not,
    setting the examined position to be:

$$ep=p(i)+k-1+n$$

where, $p(i)$ is another occurrence of the symbol of interest in the dictionary, and
returning to step d, if yes,
    f) incrementing the incrementing value n,
determining lithe first symbol located at position $c(k+n)$ in the string matches the second symbol located at the examined position $ep=p(i)+k-1+n$ in the dictionary, if yes, then returning to step f,
    if not, then determine if the intermediate symbols match,
    if not, then set the position $p(i)$ to be at another occurrence of the symbol of interest in the dictionary and, returning to step d,
    if yes, then set k to be $k-1+n$, and returning to step d, g) repeating the locating and determining steps until all positions in said dictionary in which the symbol of interest occurs have been identified.

\* \* \* \* \*